United States Patent
Choi

(10) Patent No.: US 7,947,987 B1
(45) Date of Patent: May 24, 2011

(54) METHOD OF MANUFACTURING ORGANIC LIGHT EMITTING DISPLAY AND ORGANIC LIGHT EMITTING DISPLAY

(75) Inventor: Howon Choi, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/953,060

(22) Filed: Nov. 23, 2010

Related U.S. Application Data

(62) Division of application No. 12/292,632, filed on Nov. 21, 2008, now Pat. No. 7,863,064.

(30) Foreign Application Priority Data

May 27, 2008 (KR) ........................ 10-2008-0049295

(51) Int. Cl.
*H01L 29/04* (2006.01)
*H01L 21/00* (2006.01)
(52) U.S. Cl. .......................................... 257/72; 438/29
(58) Field of Classification Search .................... 257/59, 257/72, 79, 88, E21.413; 438/29, 69; 345/87
See application file for complete search history.

(56) References Cited

U.S. PATENT DOCUMENTS

| 6,501,227 | B1 | 12/2002 | Koyama |
| 6,512,504 | B1 * | 1/2003 | Yamauchi et al. ............... 345/87 |
| 7,432,529 | B2 | 10/2008 | Yamazaki et al. |
| 7,863,064 | B2 * | 1/2011 | Choi .............................. 438/29 |

FOREIGN PATENT DOCUMENTS

| CN | 1419297 | 5/2003 |
| CN | 1734746 | 2/2006 |
| CN | 1983622 | 6/2007 |

\* cited by examiner

*Primary Examiner* — Calvin Lee
(74) *Attorney, Agent, or Firm* — McKenna Long & Aldridge LLP

(57) ABSTRACT

A method of manufacturing an organic light emitting display includes: forming a transistor on a substrate; forming a cathode electrode on the transistor to be connected to a source or a drain of the transistor; forming a bank layer having an opening on the cathode electrode; allowing a natural oxide layer to form on the cathode electrode; removing the natural oxide layer from the cathode electrode; forming an insulating buffer layer on the cathode electrode; forming an organic light emitting layer on the insulating buffer layer; and forming an anode electrode on the organic light emitting layer.

2 Claims, 6 Drawing Sheets

METHOD OF MANUFACTURING ORGANIC LIGHT EMITTING DISPLAY AND ORGANIC LIGHT EMITTING DISPLAY This application is a Divisional of application Ser. No. 12/292,632 filed Nov. 21, 2008, now U.S. Pat. No. 7,863,064 now allowed, which claims priority to Korean Patent Application No. 10-2008-0049295, filed May 27, 2008, all of which are hereby incorporated by reference for all purposes as if fully set forth herein.

BACKGROUND OF THE INVENTION

1. Field of the Invention

The present invention relates to a method of manufacturing an organic light emitting display and an organic light emitting display.

2. Discussion of the Related Art

An organic light emitting element used in an organic light emitting display has a self-emission structure in which a light emitting layer is formed between two electrodes on a substrate.

The organic light emitting element is classified into a top or emission type organic light emitting element and a bottom emission type organic light emitting element depending on a direction in which light is emitted. The organic light emitting element is also classified into a passive or matrix type organic light emitting element and an active matrix type organic light emitting element depending on a manner in which the display is driven.

In the organic light emitting display, a scan signal, a data signal, a power, etc. are supplied to a plurality of subpixels arranged in a matrix format and light is emitted from the selected subpixels, thereby displaying an image.

The subpixel includes a transistor on the substrate and an organic light emitting diode on the transistor. The organic light emitting diode is classified into a normal organic light emitting diode including an anode electrode, an organic light emitting layer, and a cathode electrode and an inverted organic light emitting diode including a cathode electrode, an organic light emitting layer, and an anode electrode.

In the organic light emitting display including the inverted organic light emitting diode, when electrodes forming the cathode electrode are deposited, an interface between the electrodes is oxidized. Hence, the reliability and life span of the organic light emitting display is reduced.

SUMMARY OF THE INVENTION

Accordingly, the present invention is directed to a method of manufacturing an organic light emitting display and an organic light emitting display that substantially obviate one or more of the problems due to limitations and disadvantages of the related art.

An advantage of the present invention is to provide an organic light emitting display having improved reliability and life span.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing an organic light emitting display includes forming a transistor on a substrate, forming a cathode electrode on the transistor to be connected to a source or a drain of the transistor, forming a bank layer having an opening on the cathode electrode, removing a natural oxide layer on the cathode electrode, forming an insulating buffer layer on the cathode electrode, forming an organic light emitting layer on the insulating buffer layer, and forming an anode electrode on the organic light emitting layer.

In another aspect of the present invention, an organic light emitting display includes a transistor on a substrate, a cathode electrode that is positioned on the transistor to be connected to a source or a drain of the transistor, a bank layer having an opening on the cathode electrode, an insulating buffer layer on the cathode electrode, an organic light emitting layer on the insulating buffer layer, and an anode electrode on the organic light emitting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF EMBODIMENTS

Reference will now be made in detail to embodiments of the present invention, examples of which is illustrated in the accompanying drawings.

Figure 1:
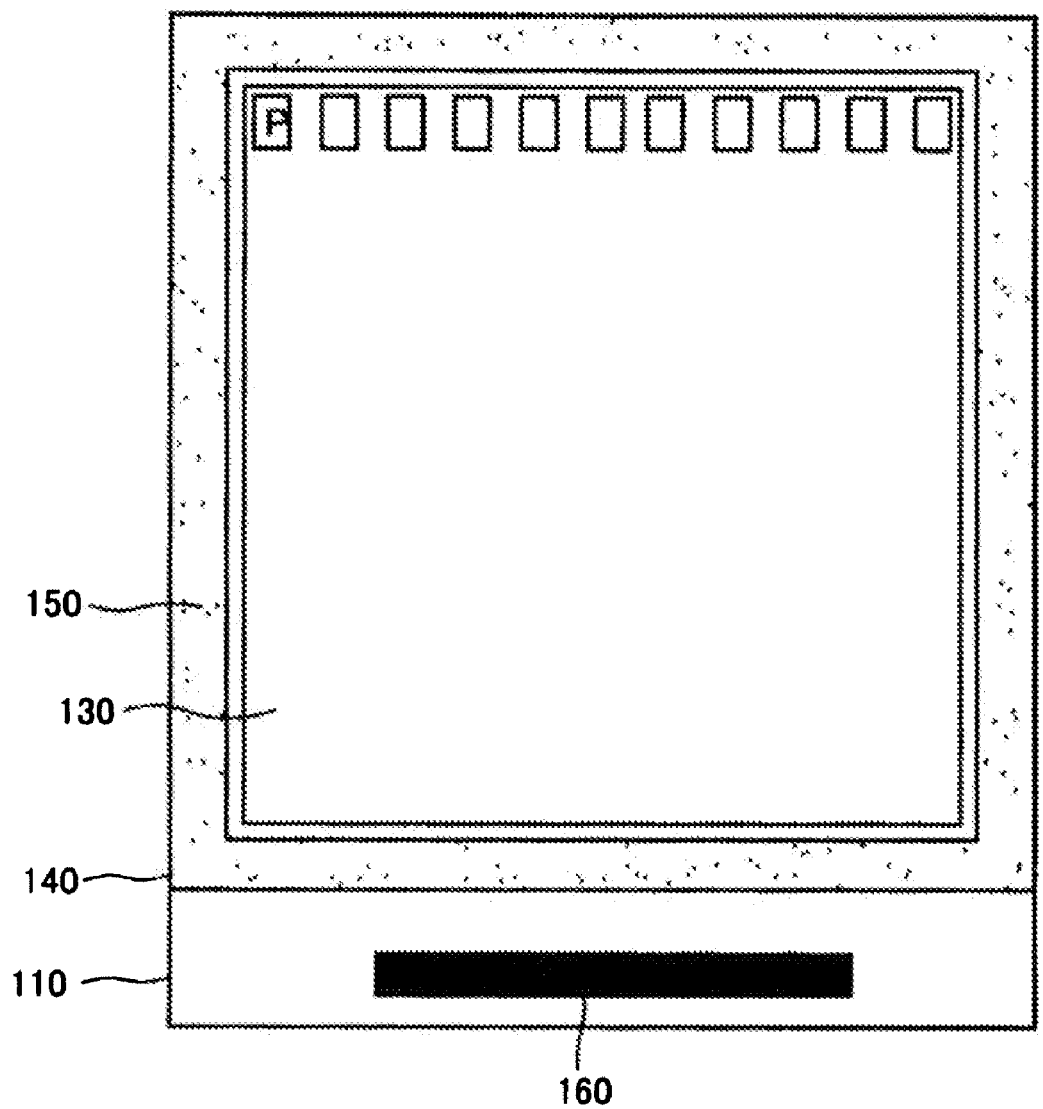
FIG. 1 is a plane view sequentially illustrating an organic light emitting display according to an exemplary embodiment of the invention.

As shown in FIG. 1, an organic light emitting display may include a display unit 130 including a plurality of subpixels P on a substrate 110. Each subpixel P may include a transistor on the substrate 110 and an organic light emitting diode on the transistor.

The subpixels P on the substrate 110 are weak in moisture or oxygen. Therefore, the substrate 110 and a seal substrate 140 are encapsulated using an adhesive member 150 formed outside the display unit 130. The subpixels P are driven by a driver 160 on the substrate 110, thereby displaying an image.

The driver 160 can produces a scan signal, a data signal, etc. in response to various signals received from the outside and can supply the produced signals to the subpixels P.

The driver 160 may include a scan driver supplying the scan signals to the subpixels P and a data driver supplying the data signals to the subpixels P. In FIG. 1, the scan driver and the data driver are formed on one board, but at least one of the scan driver and the data driver may be positioned on the substrate 110 or outside the substrate 110.

The subpixels P may be formed through the following process.

Figure 2:
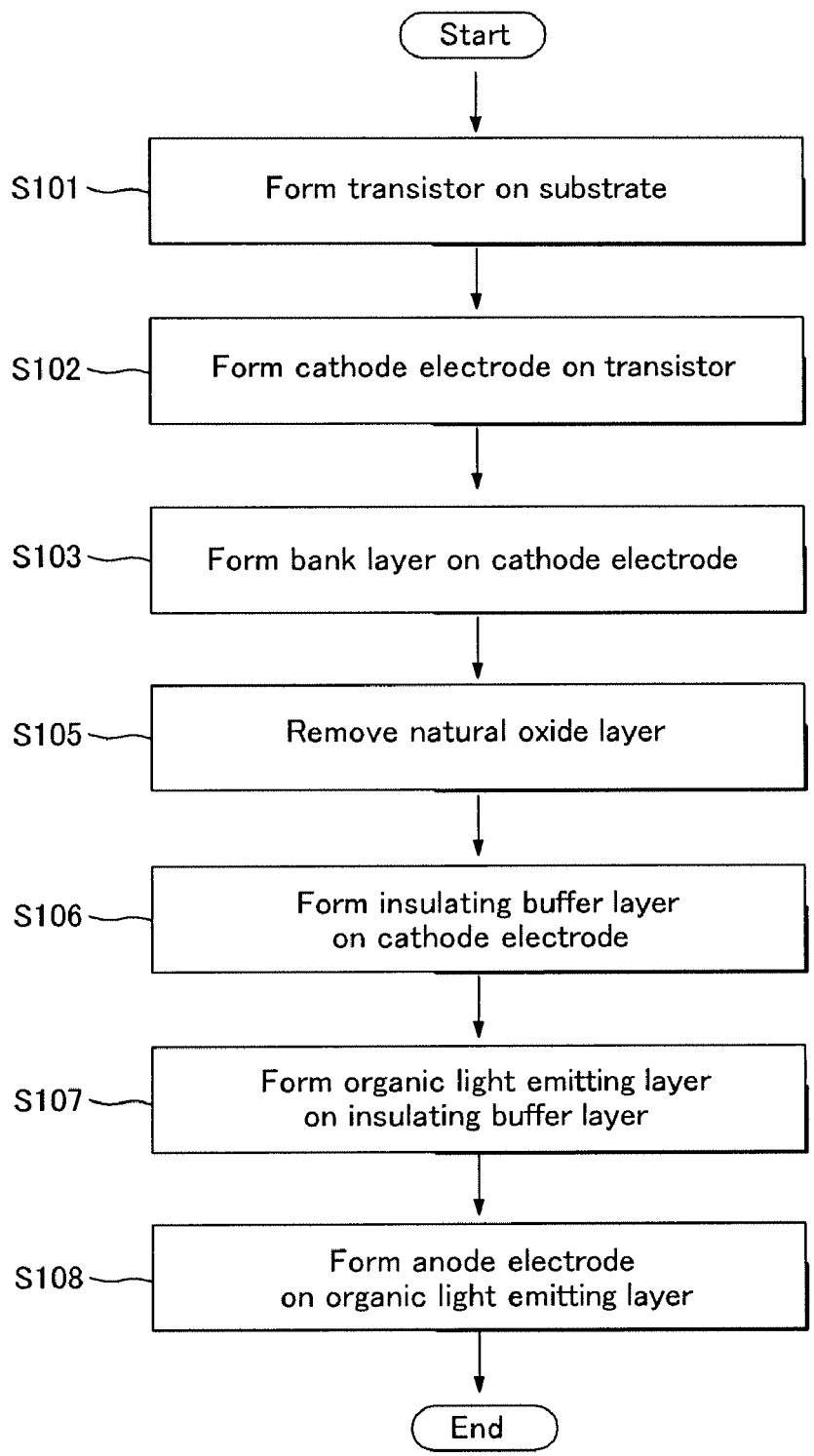
FIG. 2 is a flow chart of a method of manufacturing the organic light emitting display.
Figure 3:
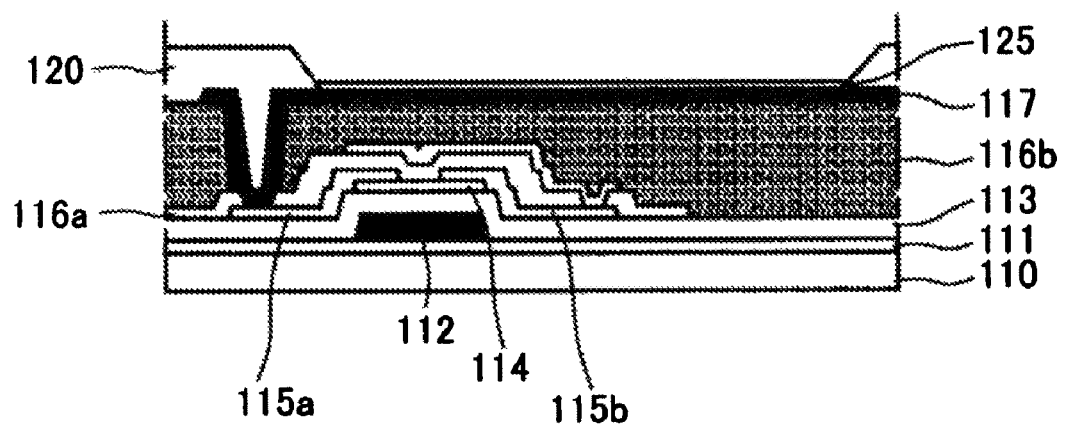
FIGS. 3 to 8 are cross-sectional views sequentially illustrating each of stages in the method of manufacturing the organic light emitting display.

As shown in FIGS. 2 and 3, the transistor is formed on the substrate 110 in step S101.

The substrate 110 may be formed of a material of which a mechanical strength or a size stability are excellent. The substrate 110 may be a glass substrate, a metal substrate, a ceramic substrate, or a plastic substrate. The plastic substrate may be formed of polycarbonate resin, acrylic resin, vinyl chloride resin, polyethyleneterephthalate resin, polyimide resin, polyester resin, epoxy resin, silicon resin, and fluorine resin, but is not limited thereto.

A buffer layer 111 may be positioned on the substrate 110. The buffer layer 111 prevents impurities (e.g., alkali ions discharged from the substrate 110) from being introduced during formation of the transistor in a succeeding process. The buffer layer 111 may be selectively formed using silicon oxide ($SiO_2$), silicon nitride ($SiN_x$), or using other materials.

A gate 112 may be positioned on the buffer layer 111. The gate 112 may be formed of any one selected from the group consisting of molybdenum (Mo), aluminum (Al), chromium (Cr), gold (Au), titanium (Ti), nickel (Ni), neodymium (Nd) and copper (Cu), or a combination thereof, but is not limited thereto. The gate 112 may have a multi-layered structure formed of Mo, Al, Cr, Au, Ti, Ni, Nd, or Cu, or a combination thereof. For example, the gate 112 may have a double-layered structure including Mo/Al—Nd or Mo/Al.

A first insulating layer 113 may be positioned on the gate 112. The first insulating layer 113 may include a silicon oxide ($SiO_x$) layer, a silicon nitride ($SiN_x$) layer, or a multi-layered structure or a combination thereof, but is not limited thereto.

An active layer 114 may be positioned on the first insulating layer 113. The active layer 114 may be formed of amorphous silicon or crystallized polycrystalline silicon. Although it is not shown, the active layer 114 may include a channel region, a source region, and a drain region. The source region and the drain region may be doped with p-type or n-type impurities. The active layer 114 may include an ohmic contact layer for reducing a contact resistance.

A source 115a and a drain 115b may be positioned on the active layer 114. The source 115a and the drain 115b may have a single-layered structure or a multi-layered structure. When the source 115a and the drain 115b have the single-layered structure, the source 115a and the drain 115b may be formed of Mo, Al, Cr, Au, Ti, Ni, Nd, or Cu, or a combination thereof. When the source 115a and the drain 115b have the multi-layered structure, the source 115a and the drain 115b may have a double-layered structure including Mo/Al—Nd or a triple-layered structure including Mo/Al/Mo or Mo/Al—Nd/Mo.

A second insulating layer 116a may be positioned on the source 115a and the drain 115b. The second insulating layer 116a may include a silicon oxide ($SiO_x$) layer, a silicon nitride ($SiN_x$) layer, or a multi-layered structure or a combination thereof, but is not limited thereto. The second insulating layer 116a may be a passivation layer.

A planarization layer 116b may be positioned on the second insulating layer 116a to increase a planarization level.

As shown in FIGS. 2 and 3, a cathode electrode 117 is formed on the transistor to be connected to the source 115a or the drain 115b of the transistor in step S102. The cathode electrode 117 may be formed of a metal such as Al.

As shown in FIGS. 2 and 3, a bank layer 120 having an opening is formed on the cathode electrode 117 in step S103. The bank layer 120 may be formed of an organic material such as benzocyclobutene (BCB)-based resin, acrylic resin, or polyimide resin.

Figure 4:
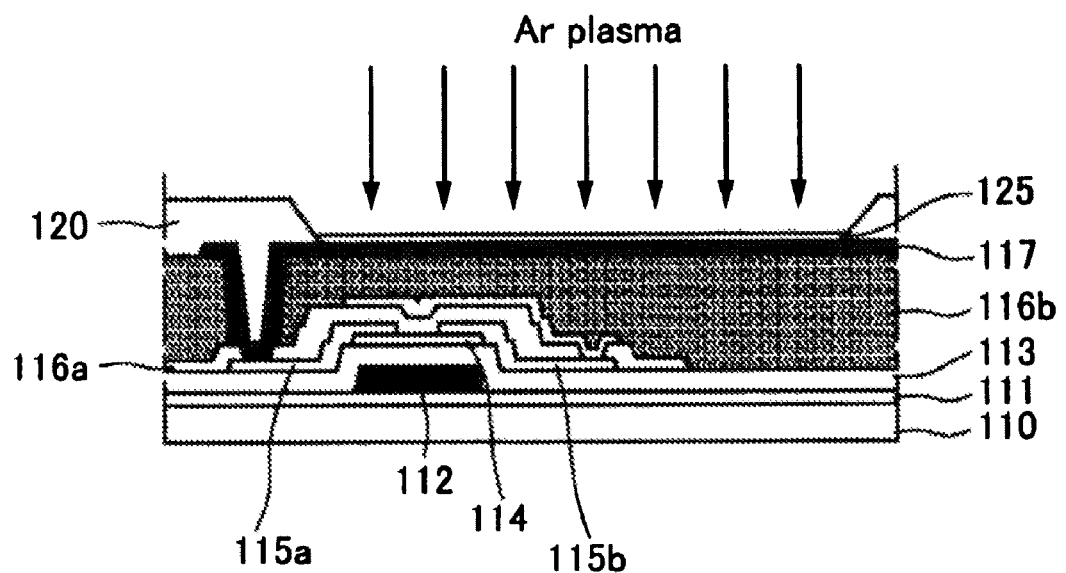
Figure 5:
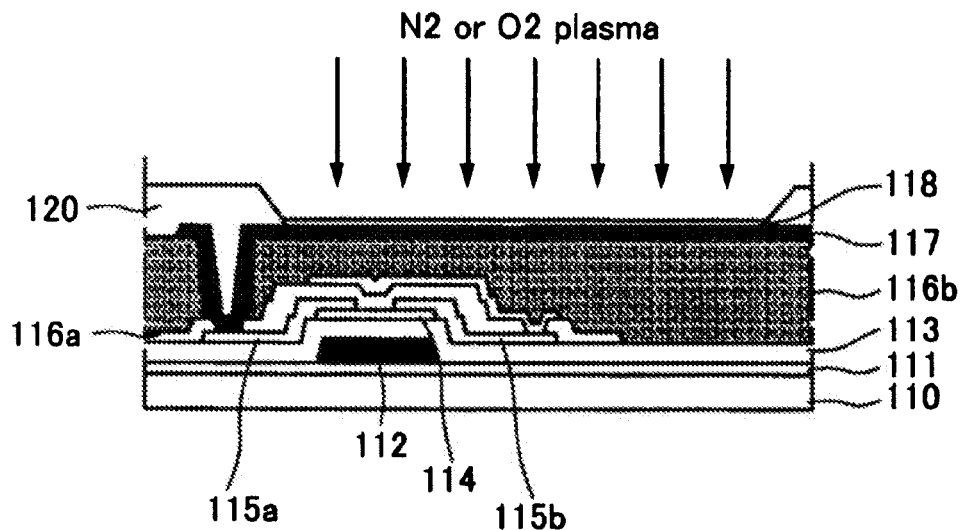

As shown in FIGS. 2 to 4, a natural oxide layer 125 is removed in step S105.

More specifically, as shown in FIG. 3, the natural oxide layer 125 is formed on a portion of the cathode electrode 117 exposed by the opening of the bank layer 120. The cathode electrode 117 is exposed in oxygen or air during a manufacturing process, thereby resulting in a formation of the natural oxide layer 125. The manufacturing process may include a case where an oxide layer is naturally formed on the surface of the cathode electrode 117 by a movement of a chamber. A thickness of the natural oxide layer 125 may be 50 Å to 70 Å.

As shown in FIG. 4, argon (Ar) plasma may be used to remove the natural oxide layer 125. The removal of the natural oxide layer 125 may be performed in an atmosphere of a transformer coupled plasma (TCP) chamber, to which a pressure of 2 to 10 m Ton, an Ar injection amount of 10 to 50 Sccm, a chamber power of 300 to 1,000 W, and a bias power of 100 to 300 W are applied, for a processing time that exceeds 0 and is equal to or less than 90 seconds. The chamber power is a power applied to the TCP chamber, and the bias power is a power applied to a chuck under the substrate 110.

A reason why the removal of the natural oxide layer 125 is performed in the atmosphere of the TCP chamber for the processing time that exceeds 0 and is equal to or less than 90 seconds is to prevent a damage of the surface of the cathode electrode 117 caused by an Ar plasma sputter.

Processing conditions for the removal of the natural oxide layer 125 are described with reference to Table 1.

TABLE 1

|  | Pressure (m Torr) | Ar injection amount | Chamber power (W) | Bias power (W) | Time (seconds) | Damage degree |
|---|---|---|---|---|---|---|
| Condition | 2 to 10 | 10 to 50 | 300 to 1,000 | 100 to 300 | 0, 30, 60, 90 | No damage |
|  |  |  |  |  | 120 | Damage 1 |
|  |  |  |  |  | 180 | Damage 2 |
|  |  |  |  |  | 300 | Damage 3 |

As indicated in Table 1, when the removal of the natural oxide layer 125 was performed in the atmosphere of the TCP chamber for the processing time that exceeds 0 and is equal to or less than 90 seconds, the natural oxide layer 125 was removed without the damage of the surface of the cathode electrode 117.

However, when the removal of the natural oxide layer 125 was performed for 120 seconds under the same conditions, the damage 1 occurred. The damage 1 means a damage occurring outside a light emitting area, i.e., outside the cathode electrode 117 adjacent to the opening of the bank layer 120.

When the removal of the natural oxide layer 125 was performed for 180 seconds under the same conditions, the damage 2 occurred. The damage 2 means a damage occurring in the bank layer 120 as well as the cathode electrode 117.

When the removal of the natural oxide layer 125 was performed for 300 seconds under the same conditions, the damage 3 occurred. The damage 3 means a damage occurring throughout the light emitting area as well as the cathode electrode 117 and the bank layer 120.

Accordingly, when the removal of the natural oxide layer 125 is performed in the above-described atmosphere of the TCP chamber for the processing time that exceeds 0 and is equal to or less than 90 seconds, the natural oxide layer 125 can be removed without the damage of the surface of the cathode electrode 117.

As shown in FIGS. 2 to 5, an insulating buffer layer 118 is formed on the cathode electrode 117 in step S106. The step 106 for forming the insulating buffer layer 118 may include a nitrogen ($N_2$) plasma or oxygen ($O_2$) plasma preprocessing process. Accordingly, after the plasma preprocessing process is performed, the insulating buffer layer 118 is formed. In case the cathode electrode 117 is formed of aluminum (Al), the insulating buffer layer 118 may be formed of aluminum nitride ($AlN_x$) or aluminum oxide ($AlO_x$). A thickness of the insulating buffer layer 118 may be 5 Å to 10 Å.

Figure 6:
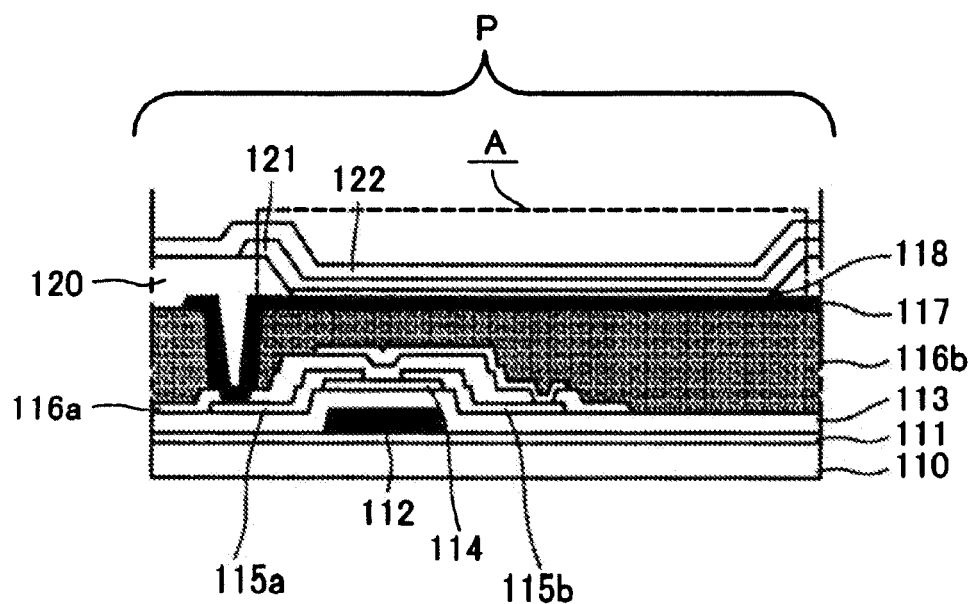
Figure 7:
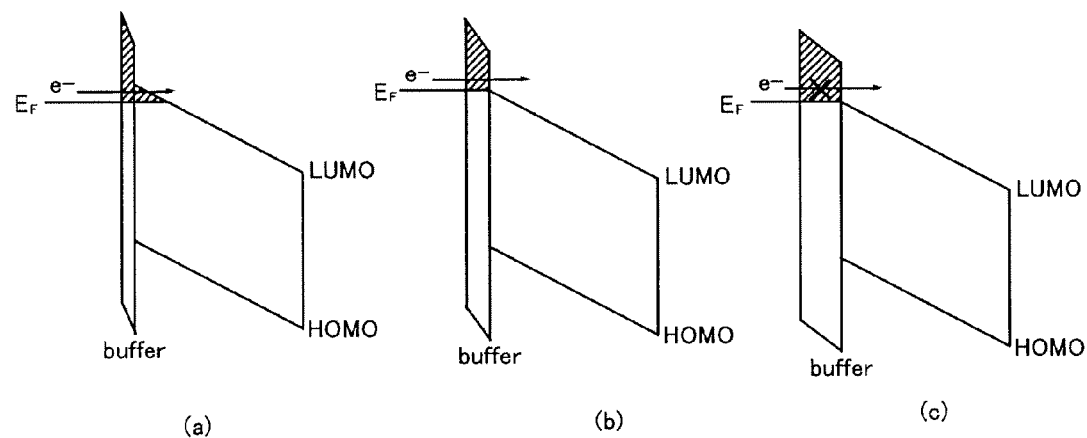

FIGS. 6 and 7 are example diagrams for illustrating a tunneling of electrons depending on the thickness of the insulating buffer layer 118. In FIG. 7, "buffer" indicates the insulating buffer layer 118; a left portion and a right portion about "buffer" indicating the insulating buffer layer 118 indicate a cathode region and an electron injection region, respectively; and HOMO and LUMO are acronyms for highest occupied molecular orbital and lowest unoccupied molecular orbital, respectively.

When the thickness of the insulating buffer layer 118 is 5 Å to 10 Å, as shown in (a) and (b) of FIG. 7, it is possible to inject electrons (e−) from the cathode electrode 117 to an electron injection layer. In other words, although the insulating buffer layer 118 is positioned on the cathode electrode 117, the electrons (e−) can be injected from the cathode electrode 117 to the electron injection layer because of low entry barriers $E_F$ of the electrons (e−).

When the thickness of the insulating buffer layer 118 is larger than 10 Å, as shown in (c) of FIG. 7, it is difficult to inject the electrons (e−) from the cathode electrode 117 to the electron injection layer. In other words, in case the thickness of the insulating buffer layer 118 is out of the range of 5 Å to 10 Å, because the insulating buffer layer 118 has properties similar to properties of an insulating layer, it is difficult to move the electrons (e−).

Accordingly, when the step 106 for forming the insulating buffer layer 118 on the cathode electrode 117 is performed, the thickness of the insulating buffer layer 118 may be 5 Å to 10 Å so that the tunneling of the electrons (e−) from the cathode electrode 117 to the electron injection layer occurs.

The S105 for removing the natural oxide layer and the step 106 for forming the insulating buffer layer 118 may be successively performed in the same chamber, and it is effective in a process tact time.

As shown in FIGS. 2 and 6, an organic light emitting layer 121 is formed on the insulating buffer layer 118 in step S107, and an anode electrode 122 is formed on the organic light emitting layer 121 in step S108.

Figure 8:
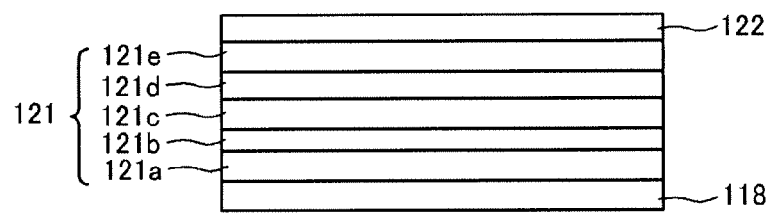

The organic light emitting layer 121 formed between the insulating buffer layer 118 and the anode electrode 122 may have the following structure shown in FIG. 8.

As shown in FIG. 8, the organic light emitting layer 121 may include an electron injection layer 121a, an electron transport layer 121b, a light emitting layer 121c, a hole transport layer 121d, and a hole injection layer 121e.

The electron injection layer 121a functions to facilitate the injection of electrons. The electron injection layer 121a may be formed of Alq3(tris(8-hydroxyquinolino)aluminum), PBD, TAZ, Spiro-PBD, BAlq or SAlq, but is not limited thereto.

The electron transport layer 121b functions to facilitate the transportation of electrons. The electron transport layer 121b may be formed of at least one selected from the group consisting of Alq3(tris(8-hydroxyquinolino)aluminum, PBD, TAZ, Spiro-PBD, BAlq, and SAlq, but is not limited thereto.

The light emitting layer 121c may be formed of a material capable of producing red, green, blue and white light, for example, a phosphorescence material or a fluorescence material.

In case the light emitting layer 121c produces red light, the light emitting layer 121c includes a host material including carbazole biphenyl (CBP) or N,N-dicarbazolyl-3,5-benzene (mCP). Further, the light emitting layer 121c may be formed of a phosphorescence material including a dopant material including any one selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material including PBD:Eu(DBM)3(Phen) or Perylene, but is not limited thereto.

In case the light emitting layer 121c produces green light, the light emitting layer 121c includes a host material including CBP or mCP. Further, the light emitting layer 121c may be formed of a phosphorescence material including a dopant material including Ir(ppy)3(fac tris(2-phenylpyridine)iridium) or a fluorescence material including Alq3(tris(8-hydroxyquinolino)aluminum), but is not limited thereto.

In case the light emitting layer 121c produces blue light, the light emitting layer 121c includes a host material including CBP or mCP. Further, the light emitting layer 121c may be formed of a phosphorescence material including a dopant material including (4,6-F2 ppy)2Irpic or a fluorescence material including any one selected from the group consisting of spiro-DPVBi, spiro-6P, distyryl-benzene (DSB), distyryl-arylene (DSA), PFO-based polymer, PPV-based polymer and a combination thereof, but is not limited thereto.

The hole transport layer 121d functions to smoothly transport holes. The hole transport layer 121d may be formed from at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4"-Tris(N-3-methylphenyl-N-phenyl-amino)-triphenylamine), but is not limited thereto.

The hole injection layer 121e may function to facilitate the injection of holes to the light emitting layer 121c. The hole injection layer 121e may be formed of at least one selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine), but is not limited thereto.

At least one of the electron injection layer 121a, the electron transport layer 121b, the hole transport layer 121d, and the hole injection layer 121e may be omitted.

A case where the transistor included in the subfield P is a bottom gate transistor was described above as an example. A case where the transistor included in the subfield P is a top gate transistor will be described below.

Figure 9:
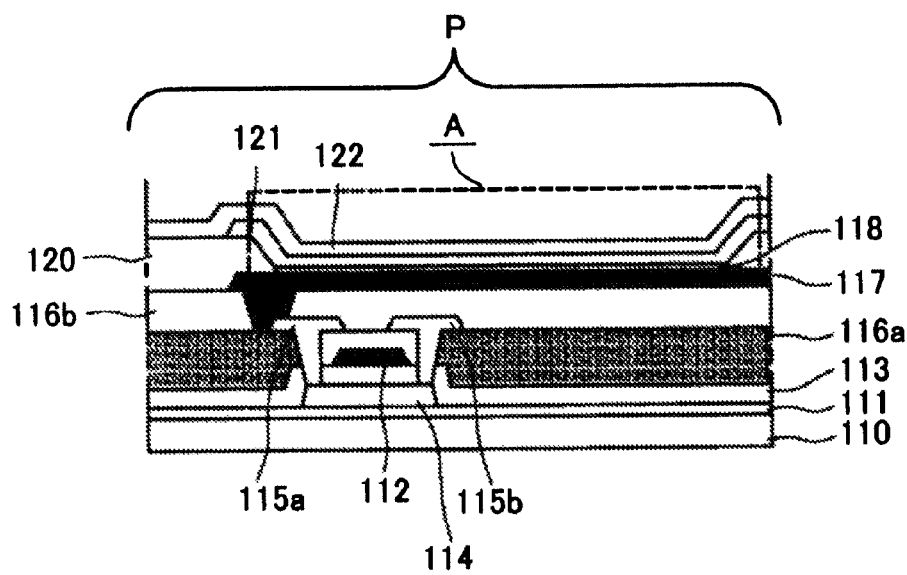
FIG. 9 is a cross-sectional view of a subpixel according to another exemplary embodiment of the invention.
Figure 10:
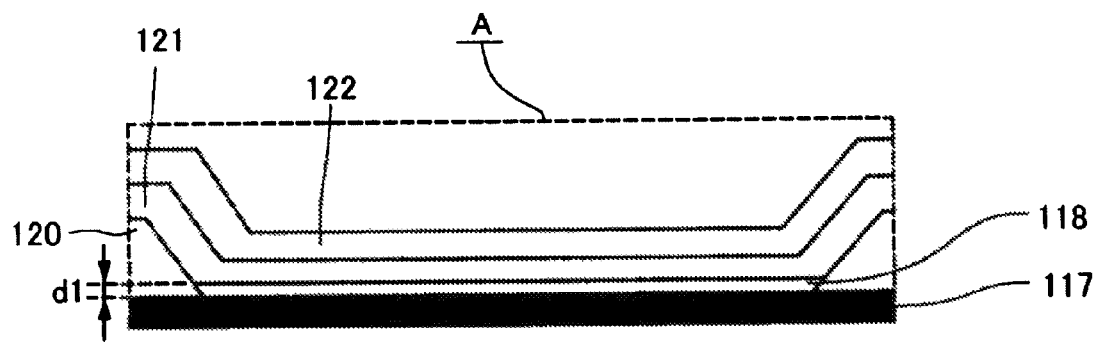
FIG. 10 is an enlarged view of an area "A" shown in FIG. 9.

As shown in FIGS. 9 and 10, a transistor included in a subfield P includes an active layer 114 on a buffer layer 111 on a substrate 110, a first insulating layer 113 on the active layer 114, a gate 112 on the first insulating layer 113, a second insulating layer 116a on the gate 112, a source 115a and a drain 115b on the second insulating layer 116a, and a third insulating layer 116b on the source 115a and the drain 115b. The source 115a and the drain 115b contact the active layer 114.

The second insulating layer 116a may be a passivation layer, and the third insulating layer 116b may be a planarization layer.

The top gate transistor may be formed through the above-described manufacturing method. More specifically, a natural oxide layer formed on a cathode electrode 117 is removed, and an insulating buffer layer 118 is formed on the cathode electrode 117. Hence, oxidization of the cathode electrode 117 generated as time elapses can be prevented, and the injection efficiency of electrons from the cathode electrode 117 to an electron injection layer can increase.

A thickness d1 of the insulating buffer layer 118 may be 5 Å t 10 Å as in the exemplary embodiment. When the thickness d1 of the insulating buffer layer 118 is 5 Å to 10 Å, as shown in (a) and (b) of FIG. 7, it is possible to inject electrons (e−) from the cathode electrode 117 to an electron injection layer. In other words, although the insulating buffer layer 118 is positioned on the cathode electrode 117, the electrons (e−) can be injected from the cathode electrode 117 to the electron injection layer because of low entry barriers $E_F$ of the electrons (e−). When the thickness d1 of the insulating buffer layer 118 is larger than 10 Å, as shown in (c) of FIG. 7, it is difficult to inject the electrons (e−) from the cathode electrode 117 to the electron injection layer. In other words, in case the thickness d1 of the insulating buffer layer 118 is out of the range of 5 Å to 10 Å, because the insulating buffer layer 118 has properties similar to properties of an insulating layer, it is difficult to move the electrons (e−).

Accordingly, the thickness d1 of the insulating buffer layer 118 may be 5 Å to 10 Å so that the tunneling of the electrons (e−) from the cathode electrode 117 to the electron injection layer occurs.

In the above-described structure of the subpixel P, the insulating buffer layer 118 may be formed of aluminum nitride ($AlN_x$) or aluminum oxide ($AlO_x$).

As described above, in the subpixel including the inverted organic light emitting diode according to the exemplary embodiments of the invention, oxidization of the cathode electrode generated as time elapses can be prevented by forming the insulating buffer layer on the cathode electrode, and also the injection efficiency of electrons from the cathode electrode to the electron injection layer can increase. Hence, the reliability and life space of the organic light emitting display can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display comprising:
   a transistor on a substrate;
   a cathode electrode that is positioned on the transistor to be connected to a source or a drain of the transistor;
   a bank layer having an opening on the cathode electrode;
   a natural oxide layer formed on the cathode electrode, wherein the natural oxide layer is removed by performing in an atmosphere of a transformer coupled plasma chamber (TCP) to which a pressure of 2 to 10 mTorr, an Ar injection amount of 10 to 50 sccm, a chamber power of 300 to 1000 W, and a bias power of 100 to 300 W are applied;
   an insulating buffer layer on the cathode electrode, wherein the insulating buffer layer is formed of aluminum nitride (AlNx) or aluminumoxide ($AlO_x$);
   an organic light emitting layer on the insulating buffer layer; and
   an anode electrode on the organic light emitting layer.

2. The organic light emitting display of claim 1, wherein a thickness of the insulating buffer layer is 5 Å to 10 Å.

* * * * *